(12) United States Patent
Sohn et al.

(10) Patent No.: US 9,153,514 B2
(45) Date of Patent: Oct. 6, 2015

(54) POWER MODULE PACKAGE

(75) Inventors: Young Ho Sohn, Gyunggi-do (KR);
Young Hoon Kwak, Gyunggi-do (KR);
Jong Man Kim, Gyunggi-do (KR); Kyu Hwan Oh, Gyunggi-do (KR); Tae Hyun Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 281 days.

(21) Appl. No.: 13/610,680

(22) Filed: Sep. 11, 2012

(65) Prior Publication Data

US 2013/0069213 A1    Mar. 21, 2013

(30) Foreign Application Priority Data

Sep. 16, 2011    (KR) ........................ 10-2011-0093541

(51) Int. Cl.
| | |
|---|---|
| *H01L 29/72* | (2006.01) |
| *H01L 23/31* | (2006.01) |
| *H01L 23/373* | (2006.01) |
| *H01L 23/433* | (2006.01) |
| *H01L 23/495* | (2006.01) |

(52) U.S. Cl.
CPC ........ *H01L 23/3107* (2013.01); *H01L 23/3735* (2013.01); *H01L 23/4334* (2013.01); *H01L 23/49537* (2013.01); *H01L 23/49575* (2013.01); *H01L 2224/32225* (2013.01); *H01L 2224/32245* (2013.01); *H01L 2224/45144* (2013.01); *H01L 2224/48227* (2013.01); *H01L 2224/48247* (2013.01); *H01L 2224/73265* (2013.01); *H01L 2924/1305* (2013.01); *H01L 2924/13034* (2013.01); *H01L 2924/13055* (2013.01); *H01L 2924/13091* (2013.01); *H01L 2924/19107* (2013.01)

(58) Field of Classification Search
CPC .............................................. H01L 2924/01079
USPC .......................................... 257/668, E23.053
See application file for complete search history.

(56) References Cited

U.S. PATENT DOCUMENTS

| | | | | |
|---|---|---|---|---|
| 2008/0048203 | A1* | 2/2008 | Son ................................. | 257/98 |
| 2010/0155914 | A1* | 6/2010 | Lim et al. ...................... | 257/675 |
| 2010/0214537 | A1* | 8/2010 | Thomas ........................... | 353/7 |

FOREIGN PATENT DOCUMENTS

KR        10-0342589        7/2002

\* cited by examiner

*Primary Examiner* — Edward Wojciechowicz
(74) *Attorney, Agent, or Firm* — Ladas & Parry, LLP

(57) ABSTRACT

Disclosed herein is a power module package including: a first substrate having one surface and the other surface; a second substrate contacting one surface of the first substrate; a third substrate contacting one side of the other surface of the first substrate; a first lead frame contacting the other side of the other surface of the first substrate; and a second lead frame electrically connected to the third substrate.

15 Claims, 1 Drawing Sheet

POWER MODULE PACKAGE

CROSS REFERENCE TO RELATED APPLICATION

This application claims the benefit of Korean Patent Application No. 10-2011-0093541, filed on Sep. 16, 2011, entitled "Power Module Package", which is hereby incorporated by reference in its entirety into this application.

BACKGROUND OF THE INVENTION

1. Technical Field

The present invention relates to a power module package.

2. Description of the Related Art

Recently, slimness, high performance, and multi-function have been demanded in home or industrial electronic components. In addition, due to an environmental regulation problem, many efforts for increasing energy efficiency have been conducted.

Currently, in home appliances such as a washing machine, a refrigerator, an air conditioner, or the like, an inverter module using a power semiconductor has been used in order to raise energy efficiency. Therefore, high reliability and multi-function have been demanded in a power semiconductor module used as an inverter.

A high power semiconductor module including a power device, for example, a power transistor, an insulated-gate bipolar transistor (IGBT), a metal oxide semiconductor (MOS) transistor, a power rectifier, a power regulator, an inverter, a converter, or a combination thereof is designed to operate at a voltage of 30 to 1000 V or more.

Since the high power semiconductor module operates at a high voltage unlike a low power semiconductor module such as a logical device or a memory device, capability to excellently radiate heat generated from a high power semiconductor chip and insulation capability at a high voltage are demanded.

Meanwhile, Korean Patent No. 0342589 discloses a power module package configured to include a lead frame in which power devices and control devices for controlling the power devices are embedded, an insulator formed on the lead frame, a sealing material formed on the lead frame and the insulator so as to enclose the power devices and the control devices.

Here, the insulator, which is a component substituting for a heat sink, is made of a material having excellent thermal conductivity and has a thin plate shape.

However, in the case of the power module package according to the prior art described above, as a size of the module increases, warpage occurs in the insulator bonded to the lead frame.

SUMMARY OF THE INVENTION

The present invention has been made in an effort to provide a power module package having a structure capable of preventing occurrence of warpage in a module even though a size of the module increases.

Further, the present invention has been made in an effort to provide a power module package having a structure capable of preventing heat generated from a power device from being transferred to a control device.

According to a preferred embodiment of the present invention, there is provided a power module package including: a first substrate having one surface and the other surface; a second substrate contacting one surface of the first substrate; a third substrate contacting one side of the other surface of the first substrate; a first lead frame contacting the other side of the other surface of the first substrate; and a second lead frame electrically connected to the third substrate.

The power module package may further include a bonding layer formed between the first and second substrates.

The bonding layer may be made of solder or epoxy.

The power module package may further include a fourth substrate disposed between the first and third substrates.

The fourth substrate may be made of plastic or silicon.

The power module package may further include a first semiconductor chip mounted on the first lead frame, wherein the first semiconductor chip is a power device.

The power module package may further include a second semiconductor chip mounted on the third substrate, wherein the second semiconductor chip is a control device.

The first substrate may be a ceramic substrate, the second substrate may be a copper foil or a ceramic plate, and the third substrate may be a printed circuit board (PCB).

The power module package may further include a package resin formed to enclose from sides of the second substrate to an upper portion of the third substrate, wherein the package resin is silicon (Si) based epoxy.

The power module package may further include comprising a heat sink bonded to a lower portion of the second substrate.

The first and second lead frames may be made of a copper (Cu) alloy or a nickel (Ni) alloy.

DESCRIPTION OF THE PREFERRED EMBODIMENTS

Figure 1:
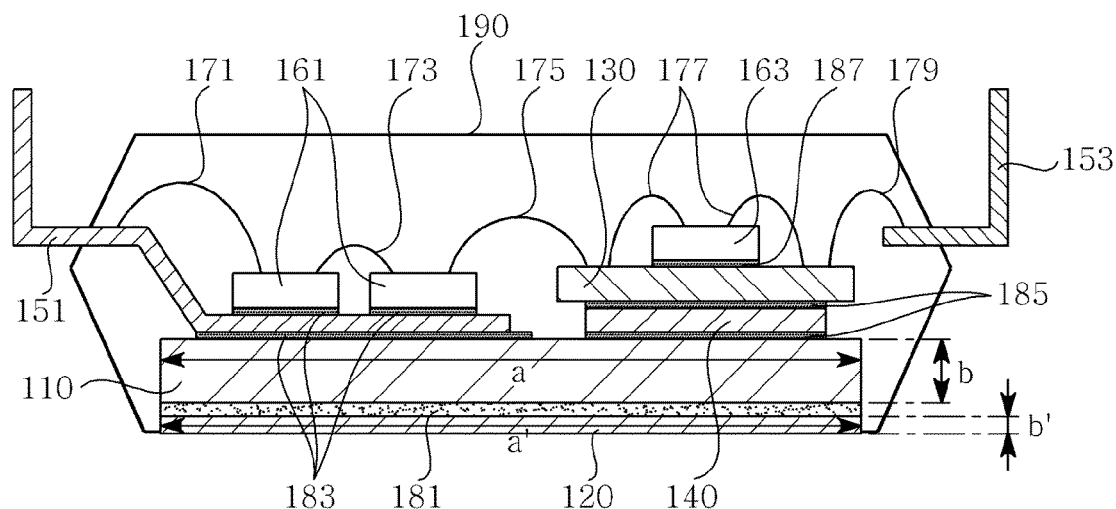
FIG. 1 is a cross-sectional view showing a structure of a power module package according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

FIG. 1 is a cross-sectional view showing a structure of a power module package according to a preferred embodiment of the present invention.

Referring to FIG. 1, the power module package 100 according to the preferred embodiment of the present invention includes a first substrate 110, a second substrate 120, a third substrate 130, a first lead frame 151, and a second lead frame 153.

According to the present embodiment, the first substrate 110 has one surface and the other surface. Here, one surface means a lower surface, that is, a surface to which the second substrate 120 is to be bonded in a subsequent process, and the other surface means an upper surface, which is opposite to one surface, based on FIG. 1. Hereinafter, each of one surface and the other surface of the first substrate 110 will be referred to as a 'lower surface' and an 'upper surface' of the first substrate 110.

According to the present embodiment, the first substrate 110 may be a ceramic substrate, but is not particularly limited thereto. That is, the first substrate 110 may include, for example, a metal substrate having an anodized layer, a printed circuit board (PCB), or a direct bonded copper (DBC) substrate.

The ceramic substrate may be made of metal based nitride or a ceramic material. Here, the metal based nitride may include aluminum nitride (AlN) or silicon nitride (SiN) and the ceramic material may include aluminum oxide ($Al_2O_3$) or beryllium oxide (BeO), but are not particularly limited thereto.

Meanwhile, the metal substrate may be made of, for example, aluminum (Al) which is a metal material capable of being easily obtained at a relatively low cost and has significantly excellent heat transfer characteristics, or an alloy thereof.

In addition, the anodized layer which is formed by immersing the metal substrate made of aluminum or an alloy thereof in an electrolyte solution such as boric acid, phosphoric acid, sulfuric acid, chromic acid, or the like, and then applying an anode to the metal substrate and applying a cathode to the electrolyte solution, has insulation characteristics and relatively high heat transfer characteristics of about 10 to 30 W/mk.

As described above, since the anodized layer has insulation characteristics, it enables a circuit layer to be formed on the metal substrate. In addition, since the anodized layer may be formed at a thickness thinner than that of a general insulation layer, it reduces a distance between the metal layer and a semiconductor chip that is to be subsequently mounted, thereby enabling thinness simultaneously with further improving heat radiating performance.

According to the present embodiment, metal layers (not shown) may be formed on both surfaces of the first substrate 110, for example, the upper and lower surfaces based on FIG. 1. This is to improve boding force in the case of using solder as an adhesive when each of the first lead frame 151 and the second substrate 120 is bonded to the upper and lower surfaces of the first substrate 110 in a subsequent process.

If epoxy is used when the second substrate 120 is bonded to the lower surface of the first substrate 110, the metal layer (not shown) may also not be formed on the lower surface of the first substrate 110.

Here, the metal layer may be made of copper (Cu), nickel (Ni), silver (Ag), gold (Au), and the like, but is not particularly limited thereto.

In addition, the metal layer may be formed by a general forming method, for example, a chemical vapor deposition (CVD) method, a physical vapor deposition (PVD) method, an electroplating process or an electroless plating process, or a sputtering process, but is not particularly limited thereto. It may be appreciated by those skilled in the art that all known metal layer forming processes may be used.

The second substrate 120 is a substrate contacting the lower surface of the first substrate 110. According to the present embodiment, the second substrate 120 may be a copper foil, a ceramic plate, or the like, but is not particularly limited thereto.

In addition, although FIG. 1 shows that the second substrate 120 has the same width a' as a width a of the first substrate 110 and has a lower height b' than a height b of the first substrate 110, it is only an example, and sizes of the first and second substrates 110 and 120 are not limited thereto.

According to the present embodiment, a bonding layer 181 may be formed between the first and second substrates 110 and 120 as shown in FIG. 1.

The bonding layer 181 serves to bond the first and second substrates 110 and 120 to each other. According to the present embodiment, the bonding layer 181 may be made of solder or epoxy but is not particularly limited thereto. That is, the bonding layer 181 may be made of any kind of adhesive material.

However, when electrical connection or heat radiation is required, it may be appreciated by those skilled in the art that a conductive adhesive material including solder needs to be used.

Here, the epoxy includes conductive epoxy and non-conductive epoxy. As described above, when the electrical connection or the heat radiation is required, the conductive epoxy may be used, and when the electrical connection or the heat radiation is not required, the non-conductive epoxy may be used.

As described above, the second substrate 120 is bonded to the lower surface of the first substrate 110, such that the second substrate 120 pulls the first substrate 100 in an opposite direction to a direction in which the first substrate 110 is bent in the case in which the first substrate 110 is bent in a 'smile' shape (used as a term indicating a shape in which left and right distal ends of the first substrate 110 are bent upwardly and a central portion thereof is bent downwardly based on FIG. 1 in the art) during a reflow process among subsequent processes, thereby offsetting force applied to the first substrate 110 in the direction in which the first substrate 110 is bent. Therefore, it is possible to prevent the first substrate 110 from being bent.

The third substrate 130 is a substrate contacting one side of the upper surface of the first substrate 110. According to the present embodiment, the third substrate 130 may be a printed circuit board (PCB) but is not particularly limited thereto.

In addition, a second semiconductor chip 163 may be mounted on the third substrate 130 as shown in FIG. 1. Here, the second semiconductor chip 163 may be a control device controlling the driving of a power device but is not particularly limited thereto.

Here, a bonding layer 187 may be formed between the third substrate 130 and the second semiconductor chip 163. Since the second semiconductor chip 163 and the third substrate 130 are electrically connected to each other for transferring an electrical signal, the bonding layer 187 may be made of solder or conductive epoxy but is not particularly limited thereto.

In addition, although FIG. 1 shows that the power module package 100 according to the present embodiment further includes a fourth substrate 140 disposed on a lower surface of the third substrate 130, that is, between one side of the upper surface of the first substrate 110 and the lower surface of the third substrate 130, the present invention is not limited thereto. That is, the third substrate 130 may also directly contact the upper surface of the first substrate 110 without the fourth substrate 140.

Here, the fourth substrate 140 may be made of plastic, silicon, or the like, but is not particularly limited thereto. That is, the fourth substrate 140 may be made of any material having significantly low thermal conductivity.

As described above, the fourth substrate 140 made of the material having significantly low thermal conductivity is additionally disposed between the first and third substrates 110 and 130, thereby making it possible to improve an effect of preventing heat from being transferred from the first substrate 110 to the second semiconductor chip 163.

Here, bonding layers 185 may be formed between the fourth and first substrates 140 and 110 and between the fourth and third substrates 140 and 130. The bonding layer 185 may be made of non-conductive epoxy in order to block heat transferred from the first substrate 110, but is not limited thereto. That is, the bonding layer 185 may also be made of other kinds of non-conductive adhesive materials.

The first lead frame 151 may have one end bonded to the other side of the upper surface of the first substrate 110, that is, a side facing the side at which the above-mentioned third substrate 130 is bonded thereto, and the other end protruded outwardly to thereby be connected to an external device.

Here, a bonding layer 183 may be formed between the first substrate 110 and the first lead frame 151 contacting the first substrate 110. The bonding layer 183 may be made of solder or conductive epoxy but is not particularly limited thereto. That is, the bonding layer 183 is generally made of a conductive adhesive material having high thermal conductivity in order to effectively radiate heat generated from first semiconductor chips 161 mounted on the first lead frame.

As described above, the first semiconductor chips 161 are mounted on the first lead frame 151 contacting the first substrate 110. Here, the first semiconductor chip 161 may be a power device.

The power device may generally include a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode including a combination thereof.

Here, a bonding layer 183 may also be formed between the first lead frame 151 and the first semiconductor chip 161. This bonding layer 183 may be made of solder or conductive epoxy having relatively high thermal conductivity in order to effectively radiate heat, but is not particularly limited thereto.

In addition, the second lead frame 153 may have one end electrically connected to the third substrate 130 by a wire bonding process and the other end protruded outwardly, as shown in FIG. 1.

Here, the wire bonding process may be performed by ball bonding, wedge bonding, and stitch bonding well known in the art.

Here, the first and second lead frames 151 and 153 may be made of a copper (Cu) alloy or a nickel (Ni) alloy, but is not particularly limited thereto.

In addition, the first lead frame 151 may have a down-set shape, but is not limited thereto.

In addition, referring to FIG. 1, the power module package 100 according to the present embodiment may further include a first wire 171 electrically connecting the first lead frame 151 and the power device 161 to each other, a second wire 173 electrically connecting between the power devices 161, a third wire 175 electrically connecting the power device 161 and the third substrate 130 to each other, a fourth wire 177 electrically connecting the third substrate 130 and the control device 163 to each other, and a fifth wire 179 electrically connecting the third substrate 130 and the second lead frame 153 to each other.

The wires are generally made of aluminum (Al), gold (Au), or copper (Cu), but are not particularly limited thereto.

For example, as the first and second wires 171 and 173 applying a rated voltage, which is a high voltage, to the power devices 161, wires mainly made of aluminum (Al) may be used, and as the third to fifth wires 175, 177, and 179, wires made of gold (Au) or copper (Cu) may be used.

The reason is that since thick wires need to be used as the first and second wires 171 and 173 that need to endure the rated voltage, which is a high voltage, aluminum (Al) is more effective in terms of cost reduction than gold (Au) or copper (Cu).

In addition, the power module package 100 according to the present embodiment may further include a package resin 190 formed to enclose from sides of the second substrate 120 to the second semiconductor chip 163 formed on the third substrate 130, as shown in FIG. 1.

The package resin 190 is to protect the wires and the first and second semiconductor chips 161 and 163 from an external environment. The package resin 190 may be, for example, an epoxy molding compound (EMC), silicon based epoxy, or the like, but is not particularly limited thereto.

Figure 2:
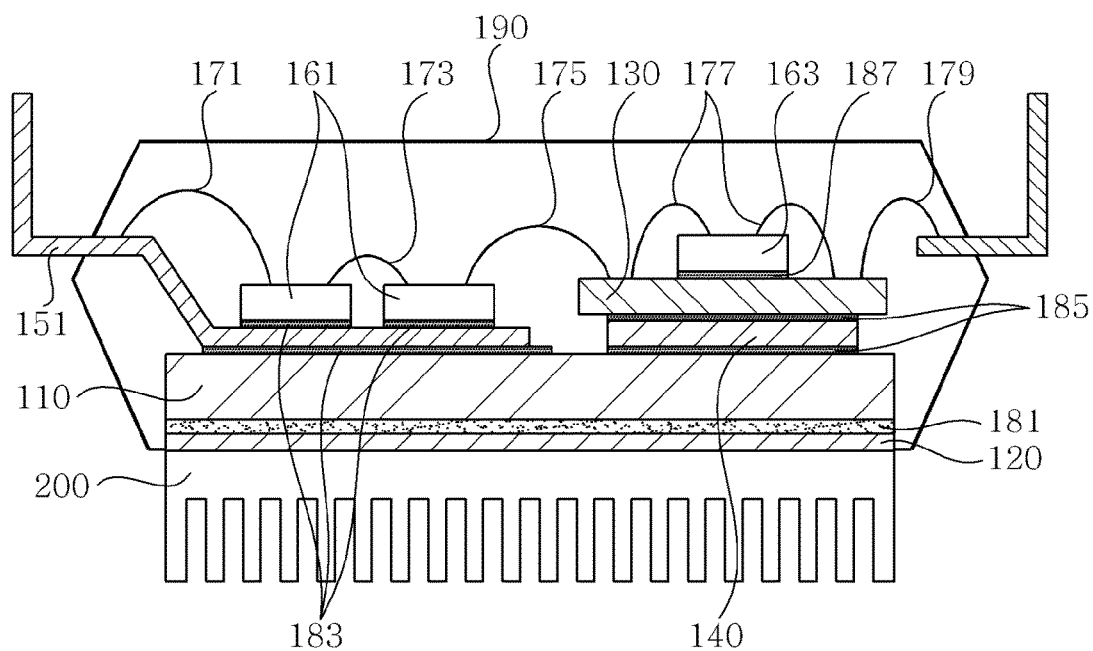
FIG. 2 is a cross-sectional view showing a state in which a heat sink is attached to a lower portion a heat radiating substrate of the power module package according to the preferred embodiment of the present invention.

In addition, the power module package 100 according to the present embodiment may further include a heat sink 200 bonded to a lower portion of the second substrate 120, as shown in FIG. 2.

The heat sink 200 includes a plurality of heat radiating pins in order to radiate heat generated from the first semiconductor chip 161, which is a power device, in the air, as shown in FIG. 2.

The heat sink 200 is generally made of a copper (Cu) material or a tin (Sn) material or formed by coating the copper (Cu) material or the tin (Sn) material, but is not particularly limited thereto. The reason is that the copper (Cu) material or the tin (Sn) material excellently transfers heat and facilitates bonding between the heat sink 200 and a heat radiating substrate.

Although not shown in FIG. 2, an adhesive material having high thermal conductivity, such as solder or conductive epoxy may be interposed between the heat sink 200 and the second substrate 120.

According to the preferred embodiment of the present invention, a substrate having a two-layer structure is used as a heat radiating substrate, thereby making it possible to prevent occurrence of warpage in a module even though a size of the module increases in accordance with an increase in rating of a power device.

In addition, according to the preferred embodiment of the present invention, two substrates having high heat radiating characteristics are bonded to each other to be used as a heat radiating substrate, thereby making it possible to improve a heat radiating effect.

Further, according to the preferred embodiment of the present invention, a power device is mounted on a lead frame bonded to a heat radiating substrate, such that heat generated from the power device is simultaneously radiated in both of the lead frame and the heat radiating substrate, thereby making it possible to improve heat radiating performance.

Furthermore, according to the preferred embodiment of the present invention, a control device is mounted on a substrate bonded to the heat radiating substrate and having low thermal conductivity, such that the power device and the control device are thermally separated from each other, thereby making it possible to prevent heat generated from the power device from being transferred to the control device.

Although the preferred embodiments of the present invention have been disclosed for illustrative purposes, they are for specifically explaining the present invention and thus a power module package according to the present invention is not limited thereto, but those skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:

1. A power module package comprising:
    a heat radiating substrate having a first substrate and a second substrate, the first and second substrates being bonded to each other;
    a third substrate formed on a top surface of the heat radiating substrate, the third substrate having a low thermal conductivity than the heat radiating substrate;
    a first lead frame formed on the top surface of the heat radiating substrate;
    a second lead frame electrically connected to the third substrate; and
    a first semiconductor chip mounted on the first lead frame.

2. The power module package as set forth in claim 1, further comprising a bonding layer formed between the first and second substrates.

3. The power module package as set forth in claim 2, wherein the bonding layer is made of solder or epoxy.

4. The power module package as set forth in claim 1, further comprising a fourth substrate disposed between the heat radiating substrate and the third substrate.

5. The power module package as set forth in claim 4, wherein the fourth substrate is made of plastic or silicon.

6. The power module package as set forth in claim 1, wherein the first semiconductor chip is a power device.

7. The power module package as set forth in claim 1, further comprising a second semiconductor chip mounted on the third substrate.

8. The power module package as set forth in claim 7, wherein the second semiconductor chip is a control device.

9. The power module package as set forth in claim 1, wherein the first substrate is a ceramic substrate.

10. The power module package as set forth in claim 1, wherein the second substrate is a copper foil or a ceramic plate.

11. The power module package as set forth in claim 1, wherein the third substrate is a printed circuit board (PCB).

12. The power module package as set forth in claim 1, further comprising a package resin formed to enclose from sides of the second substrate to an upper portion of the third substrate.

13. The power module package as set forth in claim 12, wherein the package resin is silicon (Si) based epoxy.

14. The power module package as set forth in claim 1, further comprising a heat sink bonded to a bottom surface of the heat radiating substrate.

15. The power module package as set forth in claim 1, wherein the first and second lead frames are made of a copper (Cu) alloy or a nickel (Ni) alloy.

* * * * *